United States Patent [19]

Sakamoto et al.

[11] Patent Number: 4,996,643
[45] Date of Patent: Feb. 26, 1991

[54] DIAGNOSIS SYSTEM FOR A MOTOR VEHICLE

[75] Inventors: Masanori Sakamoto; Kunihiro Abe; Tomoya Kobayashi, all of Tokyo, Japan

[73] Assignee: Fuji Jukogyo Kabushiki Kaisha, Tokyo, Japan

[21] Appl. No.: 306,892

[22] Filed: Feb. 2, 1989

[30] Foreign Application Priority Data

Feb. 18, 1988 [JP] Japan ................................ 63-036422

[51] Int. Cl.⁵ ...................... G01M 15/00; F02D 41/26; F02P 17/00
[52] U.S. Cl. ............................... 364/424.03; 73/117.2; 364/431.01; 364/551.01
[58] Field of Search ..................... 364/431.01, 551.01; 73/116, 117.2, 117.3, 119 R, 119 A

[56] References Cited

U.S. PATENT DOCUMENTS

| 4,527,424 | 7/1985 | Takahashi | 73/119 A |
| 4,694,408 | 9/1987 | Zaleski | 364/551.01 |
| 4,748,843 | 6/1988 | Schäfer et al. | 73/117.3 |
| 4,757,463 | 7/1988 | Ballou et al. | 364/551.01 |
| 4,926,330 | 5/1990 | Abe et al. | 364/424.03 |

FOREIGN PATENT DOCUMENTS 58-12848  1/1983  Japan .

*Primary Examiner*—Felix D. Gruber
*Attorney, Agent, or Firm*—Martin A. Farber

[57] ABSTRACT

An electronic control system mounted on a motor vehicle has an identification code representing the type of the vehicle. A control unit provided in a diagnosis device selects a diagnosis program for diagnosing the control system from a plurality of diagnosis programs in accordance with the identification code. A keyboard is provided for inputting another identification code. The control unit responds to the other identification code input with the keyboard for selecting the diagnosis program.

5 Claims, 6 Drawing Sheets

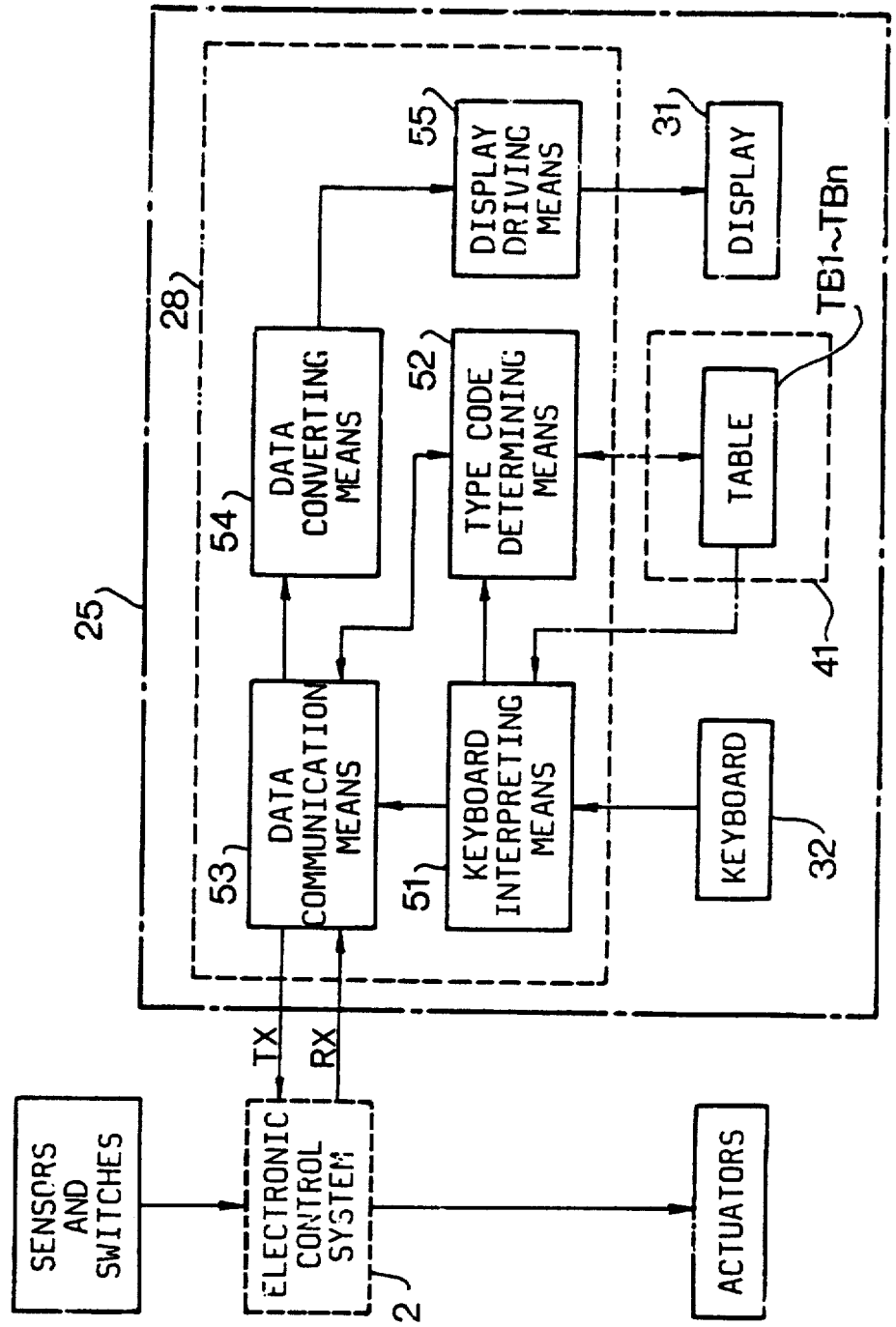

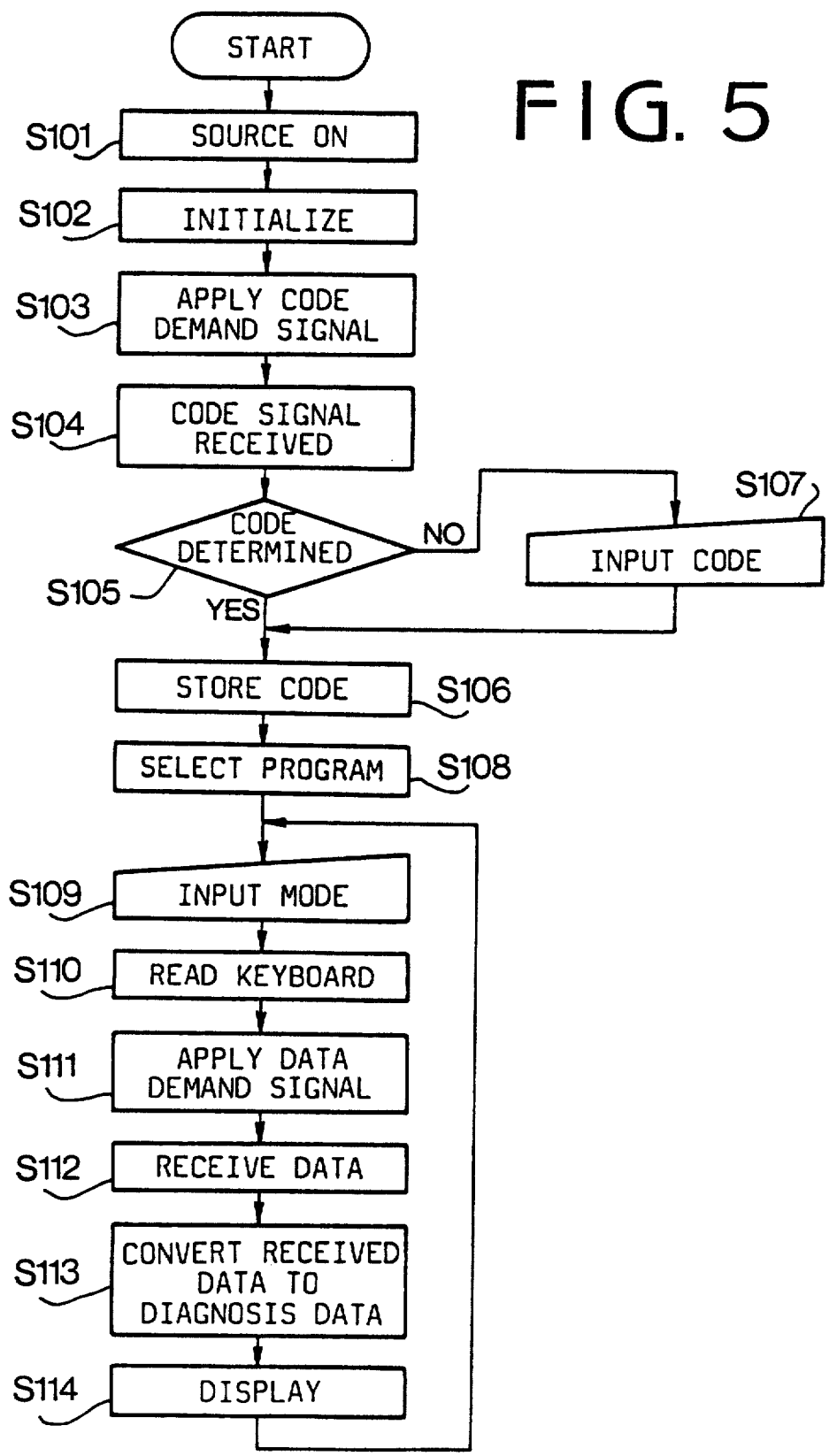

DIAGNOSIS SYSTEM FOR A MOTOR VEHICLE

BACKGROUND OF THE INVENTION

The present invention relates to a diagnosis system for a motor vehicle.

Recently, a motor vehicle has been equipped with an electronic control system for controlling various components of an engine, such as fuel injectors, thereby improving driveability, exhaust gas emission, fuel consumption and engine power. The electronic control system controls the components based on information represented by output signals from various sensors for detecting engine operating conditions. Accordingly, if malfunctions of components and sensors occur, the engine does not properly operate.

However, because of the complexity of the electronic control system, it is difficult to immediately find out trouble. Accordingly, a trouble diagnosis device for easily checking the electronic control system should be provided in an auto shop. The electronic control system has a memory and a communication system to be connected to the trouble diagnosis device.

Since the address of the memory and the communication system differ with different types of motor vehicles, an identification code of a type of motor vehicle is stored in the memory. The diagnosis device discriminates the vehicle type based on the identification code.

Japanese patent application Laid-Open 58-12848 discloses a diagnosis system in which an exclusive checking device is provided for diagnosing operations of various sensors and actuators. However, the checking device is provided for diagnosing only designated specific types of motor vehicle.

Although, a diagnosis system can store a plurality of control programs for diagnosing various types of motor vehicles in a memory, control programs for all types of motor vehicle can not be stored in the memory.

On the other hand, there is a case where diagnosis can be performed with a program for another type of vehicle. However, since the identification code is different from the other one, the program cannot be used.

SUMMARY OF THE INVENTION

The object of the present invention is to provide a diagnosis system which may diagnose the electronic control system with common programs, even if the identification code does not coincide with the code of the programs.

According to the present invention, there is provided a system for diagnosing an electronic control system mounted on a motor vehicle, the electronic control system having an identification code representing the type of the vehicle, a diagnosis device including a computer having a central processing unit and a memory, the memory storing a plurality of diagnosis programs for diagnosing the electronic control system, and display means, connecting means connecting the computer to the electronic control system, a control unit provided in the diagnosis device for selecting a diagnosis program for diagnosing the control system from the diagnosis programs in accordance with the identification code, input means for inputting another identification code, the control unit being arranged to respond to the other identification code input with the input means for selecting the diagnosis program.

The other objects and features of this invention will become understood from the following description with reference to the accompanying drawings.

BRIEF DESCRIPTION OF DRAWINGS

FIG. 3 is a block diagram showing a main part of the 20, system;

FIG. 5 is a flowchart showing an operation of the system.

DETAILED DESCRIPTION OF THE PREFERRED EMBODIMENT

Figure 1:
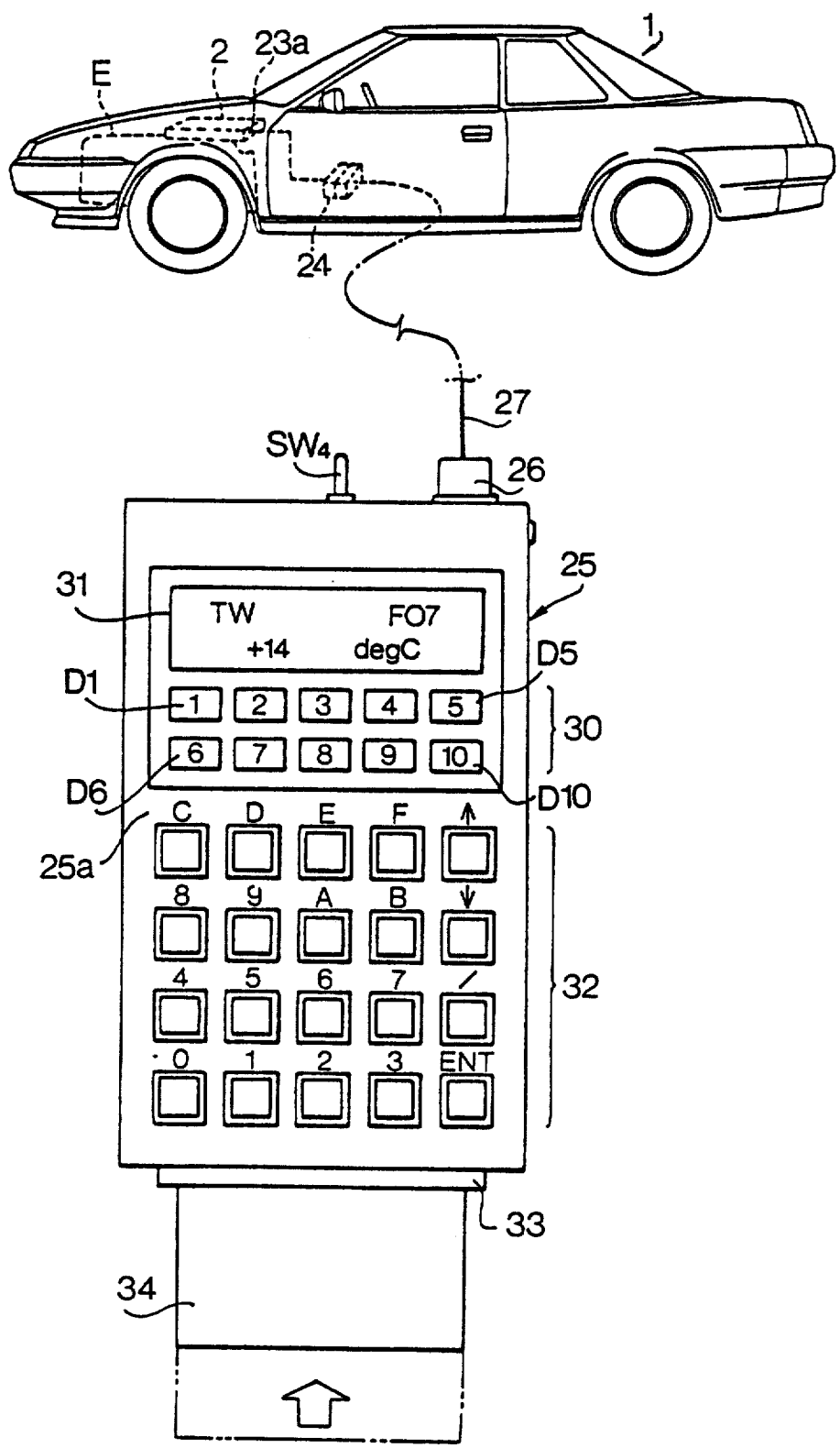
FIG. 1 is a schematic illustration of a diagnosis system according to the present invention.

Referring to FIG. 1, an automobile 1 is equipped with an electronic control system 2 for controlling various components of an engine E. The electronic control system 2 is connected to an external connector 24. A portable diagnosis device 25 comprising a microcomputer is housed in a case 25a and has a connector 26, to which the connector 24 of the system 2 is connected through an adapter harness 27.

The diagnosis device 25 has a power switch SW4, a liquid crystal display 31, an indicator section 30 consisting of a plurality of LED indicators, and a keyboard 32. A connector 33 is provided for connecting a detachable memory cartridge 34.

Figure 2A:
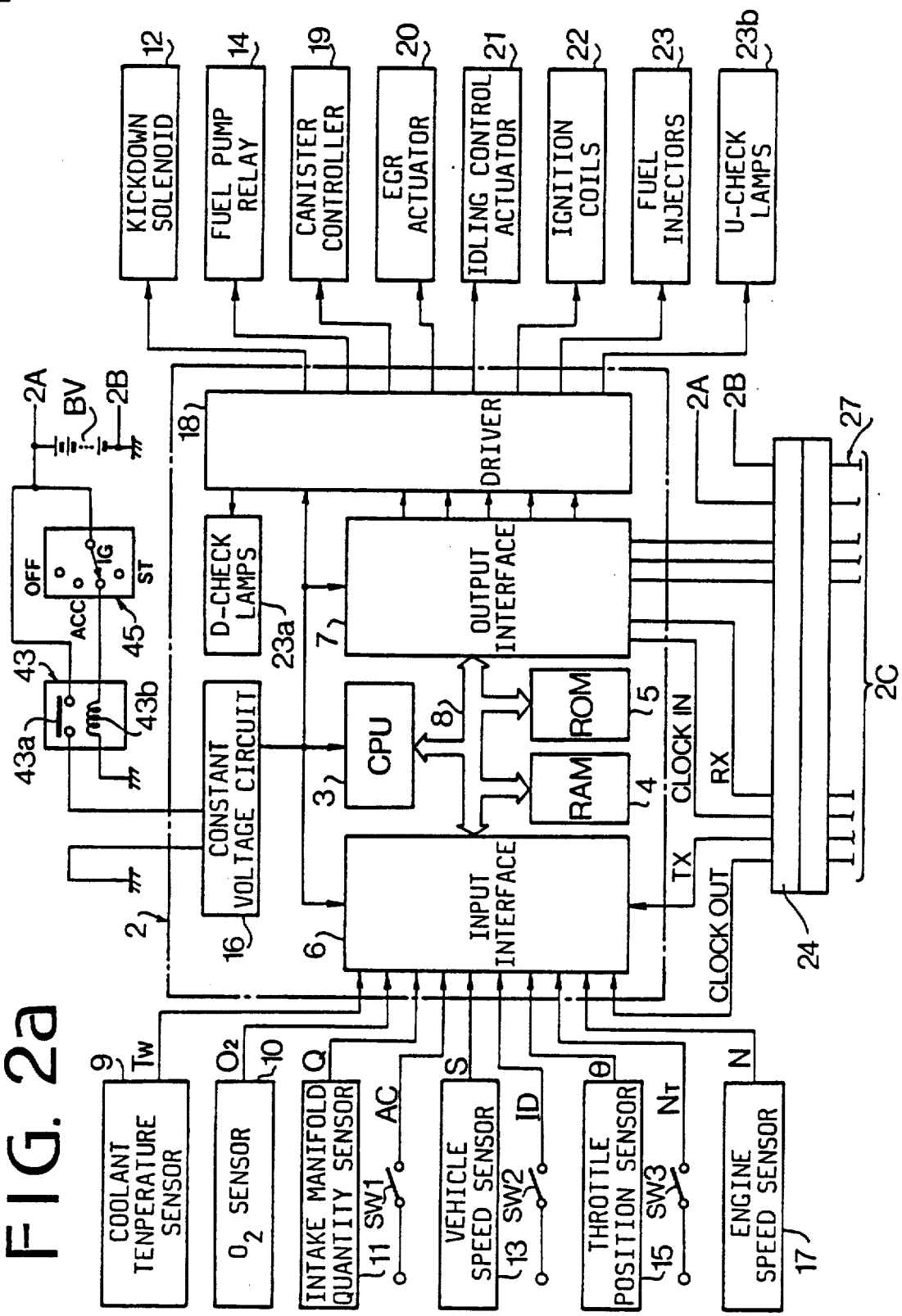
FIGS. 2a and 2b show a block diagram of the system.
Figure 2B:
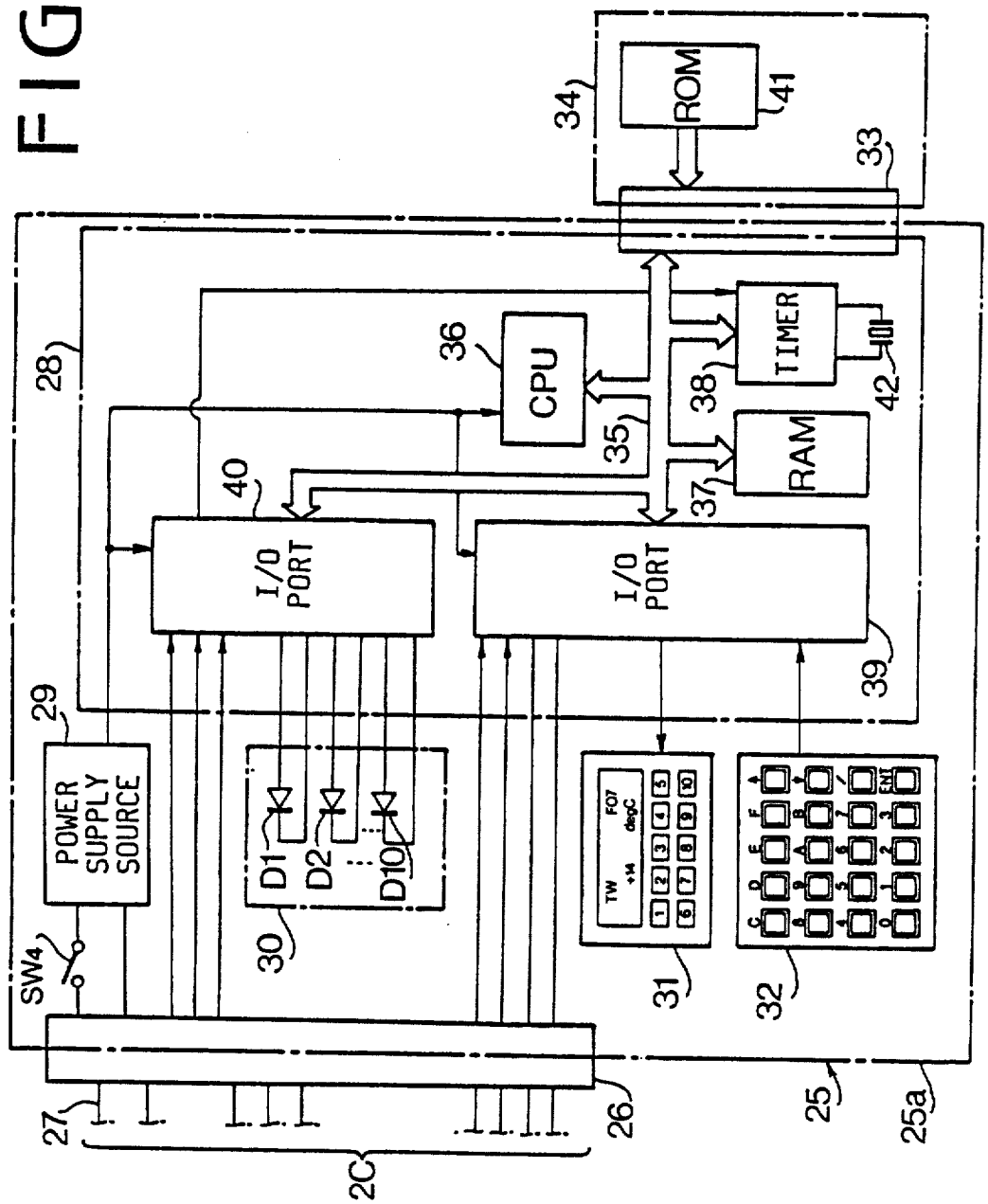

Referring to FIGS. 2a and 2b, the electronic control system 2 comprises a central processor unit (CPU) 3, a random access memory (RAM) 4, a read only memory (ROM) 5 an input interface 6,,and an output interface 7. These units, namely the CPU 3, RAM 4, ROM 5, and the input and output interfaces 6 and 7 are connected to each other through a bus line 8. Programs and data for controlling the engine and fixed data such as the type of the vehicle are stored in the ROM 5. Power is supplied to the CPU 3, input and output interfaces 6 and 7, and driver 18 from a source BV through a contact 43a of a power relay 43 and a constant voltage circuit 16. A relay coil 43b of the relay 43 is connected to the source BV through an ignition terminal IG of an ignition switch 45.

The input interface 6 is applied with a coolant temperature signal Tw from a coolant temperature sensor 9, an air-fuel ratio feedback signal $O_2$ from an $O_2$ sensor 10, an intake-air quantity signal Q from an intake manifold quantity sensor 11, a vehicle speed signal S from a vehicle speed sensor 13, a throttle valve opening degree signal - from a throttle position sensor 15, an engine speed signal N from an engine speed sensor 17, an air conditioner operating signal AC from an air conditioner switch SW1, an idling signal ID from an idle switch SW2, and a neutral positioning signal NT from a neutral switch SW3 in a transmission.

These signals are stored in the RAM 4 after processing data in accordance with the program stored in the ROM 5. The CPU 3 produces respective control signals, which are applied to the driver 18 through the output interface 7. The driver 18 produces signals for controlling a kickdown solenoid 12 of a kickdown switch, a fuel pump relay 14, a canister controller 19 of a fuel-vapor emission control system, an EGR (exhaust gas recirculation system) actuator 20, an idling control actuator 21, ignition coils 22 and fuel injectors 23.

The driver 18 further applies signals to D-check lamps 23a and U-check lamps 23b. The D-check lamps 23a are provided in the electronic control system 2 for indicating an abnormality in the system 2. When an abnormality is detected in the system 2 by a self-diagnosis function, a corresponding trouble code is read out from the ROM 5 so as to turn on or flash a plurality of lamps 23a, thereby indicating the trouble code. The U-check lamps 23b are provided on a dashboard of the vehicle so as to warn the driver of the trouble detected by the self-diagnosis function.

The diagnosis device 25 has a control unit 28 and a power supply source 29. The control unit 28 comprises a CPU 36, a RAM 37, input/output (I/O) ports 39 and 40, and a timer 38. These elements are connected to each other through a bus line 35. A clock pulse generator 42 is provided in the timer 38 for generating synchronizing pulses.

Inputs of the I/O port 40 are connected to the output interface 7 of the control system 2 through connectors 24 and 26 and harness 27 so as to receive output signals of the sensors and switches. Outputs of the port 40 are connected to the indicator section 30. Inputs of the I/O port 39 are connected to the keyboard 32 for being applied with a mode select signal dependent on the operation of the keyboard, and to the output interface 7. Outputs of the port 39 are connected to the input interface 6 and the display 31. The power source 29 for supplying the power to the CPU 36 and I/O ports 39 and 40 is connected to the source BV through the power switch SW4.

The indicator section 30 has a plurality of LEDs $D_1$ to $D_{10}$ arranged in two rows. The liquid crystal display 31 has two rows of liquid crystal cells, each row consisting of five pairs of liquid crystal cells. Each pair of cells corresponds to the respective LEDs $D_1$ to $D_{10}$. Inputting and outputting conditions of the switches and sensors are indicated by intermittently turning on the LEDs $D_1$ to $D_{10}$ in accordance with a selected checking mode.

On the liquid crystal cells of the display 31, the selected switches and sensors are indicated by identification codes. The display 31 is also capable of displaying measured values such as output voltages and pulse widths of signals from the sensors and actuators dependent on the selected mode as shown in FIG. 1.

The memory cartridge 34 selected for diagnosing the presented control system 2 is connected to the diagnosis device 25 through the connector 33. A ROM 41 provided in the memory cartridge 34 stores control programs corresponding to the identification code of the vehicle and fixed data.

Figure 4:
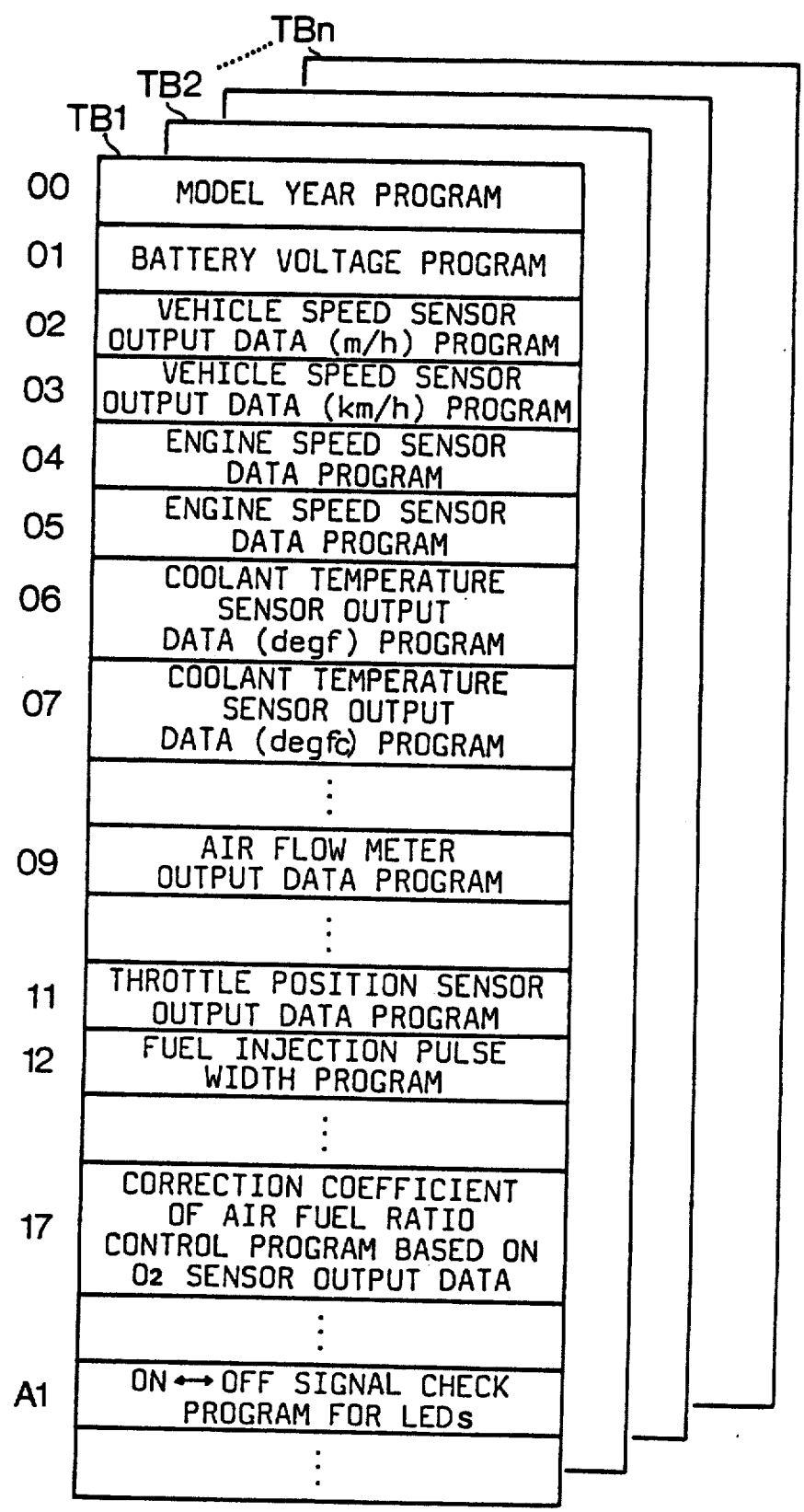
FIG. 4 is an illustration showing control programs for various vehicle type codes stored in a ROM.

Referring to FIG. 4, the ROM 41 stores, as fixed data, a plurality of tables $TB_1$ to $TB_n$, each having a control program for the specific type of the vehicle. In the ROM, various data for the type of the vehicle, such as a memory address, communication system and diagnosis programs are stored.

When a desired diagnosing mode is input by operating the keyboard 32, a designated diagnosis program is selected from the control programs stored in the tables and the diagnosis according to the diagnosis program is performed.

Referring to FIG. 3 showing the control unit 28, a keyboard interpreting means 51 is provided for interpreting a designated mode and other input by operating the keyboard 32.

A vehicle type code determining means 52 selects a control program from the tables $TB_1$ to $TB_n$ stored in the ROM 41 in the memory cartridge 34 in accordance with an identification code stored in the ROM 5 in the control system 2. A data communication means 53 retrieves a designated range corresponding to the designated mode of the selected control program in accordance with a mode signal from the keyboard interpreting means 51 based on the designated mode input by the keyboard 32. In accordance with a diagnosis program stored in the designated range, the data communication means 53 produces a data demand signal TX which is applied to the control system 2 and receives a data signal RX fed from the control system 2. A data converting means 54 converts the data received at the data communication means 53 into decimal digits. A display driving means 55 produces a signal in accordance with the output of the data converting means 54 for driving the display 31.

The operation of the system is described hereinafter with reference to the flowchart of FIG. 5. The diagnosis device 25 is connected to the electronic control system 2 through the connectors 24, 26 and harness 27. The engine is started, and the following diagnosis program is performed under the running condition of the engine.

The power switch SW4 is turned on at a step S101. At a step S102, initialization of the control unit 28 is performed. At a step S103, an identification code demand signal from the data communication means 53 is applied to the system 2. In response to the code demand signal, the control system 2 derives an identification code signal stored in the ROM 5, which is fed to the communication means 53 at a step S104.

At a step S105, in accordance with the received identification code, the vehicle type code determining means 52 retrieves a control program if it exists for the vehicle type code, from tables TB1 to TBn in the ROM 41 and determines whether the control program corresponding to the vehicle type identification code exists or not. If the corresponding control program exists, the diagnosis program goes to a step S106. If the corresponding control program is not derived, an error is displayed on the display 31 and the program proceeds to a step S107.

The diagnostician refers to a service manual to find a control program which has the same content as the program of the corresponding type code and inputs the type code of the derived program with the keyboard 32 (step S107). The vehicle type code determining means 52 treats the type code as a code for the control system 2, and the program proceeds to the step S106.

At step S106, the type code input at the step S105 or at the step S107 is stored in a predetermined address of the RAM 37.

At a step S108, the type code determining means 52 selects a control program corresponding to the type code from tables TB1 to TBn (for example from the table TB1). Consequently, the corresponding control program for the control system 2 to be diagnosed is determined and a diagnosis routine is performed in accordance with the program.

A diagnostician operates the keyboard 32 to perform the diagnosis of the engine. For example, in order to measure the coolant temperature, a mode code for the coolant temperature (for example F→0→7→ENT) is input by operating the keyboard 32 at a step S109.

The input mode is read by the CPU 36 and temporarily stored in the RAM 37. Thereafter, the mode is read and interpreted in the keyboard interpreting means 51. A program according to a mode 07 in the table TB1 representing a coolant temperature sensor output data program (FIG. 4) is read out at a step S110. At a step 111, a corresponding data demand signal TX is applied to the system 2. At a step S112, data signal RX representing a coolant temperature is applied to the means 53 from the control system 2. At a step 113, the received binary digit is converted into a decimal digit representing the coolant temperature in the means 54.

The driving means 55 produces data which is applied to the display 31. At a step S114, a measured value of the coolant temperature, for example, +14 deg C. representing the temperature, an abbreviation mark TW of coolant temperature, and the input mode indiction F07 are displayed on the display 31 as shown in FIG. 1. Thus, the diagnostician can diagnose the items about the coolant temperature.

In order to perform other diagnosis items, the keyboard operation is performed and the operations after step S109 are repeated.

In accordance with the present invention, since a control program either in accordance with a vehicle type code of the electronic control system and a vehicle type code input by operating the keyboard is used, various types of vehicles can be diagnosed.

While the presently preferred embodiment of the present invention has been shown and described, it is to be understood that this disclosure is for the purpose of illustration and that various changes and modifications may be made without departing from the scope of the invention as set forth in the appended claims.

What is claimed is:

1. In a diagnosis system for an electronic control system mounted on a motor vehicle having sensing means for detecting operating conditions of the vehicle and for producing input data, and means for storing an identification code corresponding to type of the vehicle and for storing the input data from said sensing means and for providing control data for controlling the vehicle, the diagnosis system being responsive to at least one of said data for diagnosing said at least one of said data and for providing diagnosis data, the diagnosis system comprising display means for displaying said diagnosis data, and a keyboard for inputting a code into said diagnosis system and for producing a corresponding code signal, a detachable memory cartridge detachably connected to said diagnosis system for storing a plurality of programs to diagnose said at least one data, connecting means for connecting said diagnosis system with said electronic control system and said detachable memory cartridge which have different types of data signals being transmitted in response to a demand signal, the improvement in the diagnosis system which comprises:

data converting means responsive to said diagnosis data for converting said diagnosis data and for producing a corresponding driving signal for display of the converted diagnosis data on said display means;

keyboard interpreting means responsive to the code signal corresponding to a vehicle type code inputted into said keyboard for generating a corresponding type code signal; and type code determining means responsive to said type code signal and said identification code, respectively, for retrieving a corresponding of said programs for the diagnosing.

2. A system for diagnosing an electronic control system, which includes sensors, mounted on a motor vehicle, the electronic control system containing therein an identification code representing type of the vehicle, the diagnosing system comprising a diagnosis device including a computer having a central processing unit and a memory, the memory having a plurality of diagnosis programs for diagnosing the electronic control system, and display means for indicating results of diagnosis;

connecting means for connecting the computer to the electronic control system;

the central processing unit for determining if there exists a corresponding diagnosis program corresponding to the identification code for diagnosing said electronic control system among said plurality of diagnosis programs in said memory;

the diagnosis device includes input means for manually inputting another identification code corresponding to another suitable diagnosis program of said plurality of diagnosis programs for diagnosing said electronic control system in the event said first-mentioned corresponding diagnosis program is determined by said central processing unit not to exist among said plurality of diagnosis programs in said memory; and the central processing unit for responding to said identification code from said electronic control system or to said another identification code input manually for selecting for the diagnosing said diagnosis program corresponding to said identification code from said electronic control system or said another suitable diagnosis program corresponding to said another identification code, respectively.

3. The system according to claim 2, wherein said input means is a keyboard.

4. A method for diagnosing an electronic control system which includes sensors mounted on a motor vehicle, the electronic control system containing an identification code representing type of the vehicle, the diagnosing system comprising a diagnosis device including a computer having a central processing unit and a memory, the memory having a plurality of diagnosis programs for diagnosing the electronic control system, and display means for indicating results of diagnosis, the method comprising the steps of detecting an identification code signal corresponding to the vehicle type and to the corresponding identification code from the memory in the electronic control system;

the computer determining if a diagnosis program exists or does not exist in said plurality of diagnosis programs corresponding to said identification code signal;

if said diagnosis program does not exist, selecting and inputting another identification code signal corresponding to another suitable diagnosis program of said plurality of diagnosis programs for diagnosing said electronic control system; and the computer selecting for the diagnosing the diagnosis program of said plurality of diagnosis programs corresponding to said identification code signal or corresponding to said another identification code signal, respectively, for the diagnosing of the electronic control system.

5. The method according to claim 4, further comprising the steps of
initially applying an identification code demand signal to the electronic control system, and wherein said step of detecting the identification code signal corresponding to the vehicle type and identification code from the memory in the electronic control system occurs in response to said identification code demand signal.

* * * * *